(12) United States Patent
Iwata et al.

(10) Patent No.: US 6,472,241 B2
(45) Date of Patent: Oct. 29, 2002

(54) RADICAL CELL DEVICE AND METHOD FOR MANUFACTURING GROUPS II-VI COMPOUND SEMICONDUCTOR DEVICE

(75) Inventors: Kakuya Iwata, Tsukuba (JP); Paul Fons, Tsukuba (JP); Akimasa Yamada, Ibaraki (JP); Koji Matsubara, Tsukuba (JP); Shigeru Niki, Tsukuba (JP); Ken Nakahara, Kyoto (JP)

(73) Assignees: National Institute of Advanced Industrial Science and Technology, Tokyo (JP); Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/939,719

(22) Filed: Aug. 28, 2001

(65) Prior Publication Data

US 2002/0025621 A1 Feb. 28, 2002

(30) Foreign Application Priority Data

Aug. 28, 2000 (JP) ........................ 2000-256728

(51) Int. Cl.$^7$ ............................................... H01L 21/00
(52) U.S. Cl. ............................................ 438/22; 438/220
(58) Field of Search .............................. 438/22, 28, 46, 438/57, 70, 220, 933

(56) References Cited

U.S. PATENT DOCUMENTS 6,171,438 B1 * 1/2001 Masuda et al.

* cited by examiner

*Primary Examiner*—Hoai Ho
*Assistant Examiner*—Phuc T. Dang
(74) *Attorney, Agent, or Firm*—Arent Fox Kintner Plotkin & Kahn

(57) ABSTRACT

The closing plates (61b), (61c) are provided on the both end portions of the cylindrical insulator body (61a), the gas introduction tube for introducing a gaseous substance is inserted into one plate (61b) of the closing plates of the plasma chamber (61) for making the gaseous substance plasmatic within it, and on the other plate (61c), the plasma radiation outlet (61d) is provided. Then, nearby the plasma jet (63) outgoing from the radiation outlet, the electrode (64) for applying a high electric field of an ion trapper is provided so as to be opposed to the grounded electrode (65) interposed the plasma jet between them. This electrode for applying a high electric field is fixed on the grounded metal plate (61e) provided on the other plate (61c) via the insulation porcelain (66) made of MgO or quartz. As a result, a radical cell device which does not blow-off and mix up Al into the layer epitaxially grown is obtained ,and a Groups II–VI compound semiconductor device because undoped Al is not contained in the semiconductor layers.

3 Claims, 4 Drawing Sheets

RADICAL CELL DEVICE AND METHOD FOR MANUFACTURING GROUPS II-VI COMPOUND SEMICONDUCTOR DEVICE

FIELD OF THE INVENTION

The present invention relates to a radical cell device used for enhancing the reactivity of substances by making a gaseous substance plasmatic in a MBE (Molecular Beam Epitaxy) apparatus and a sputtering apparatus, and a method of manufacturing a Groups II–VI compound semiconductor device. More particularly, the present invention relates to such a radical cell device that an impurity is not mixed up into the semiconductor layer from the radical cell device, for example, when the semiconductor layer such as ZnO based oxide compound or ZnSe which is to be a p-type semiconductor by utilizing nitrogen as a dopant is grown and a method of manufacturing a Groups II–VI compound semiconductor device using the radical cell device.

BACKGROUND OF THE INVENTION

A blue color based (which means the wavelength region from ultraviolet to yellow, hereinafter, indicating the same meaning) light emitting diode (hereinafter, referred to as LED) used for a light source of a full color display, a signal light and the like and a blue laser (hereinafter, referred to as LD) used for high precision DVD light source of the next generation which successively oscillating at the room temperature have been recently obtained by depositing GaN based compound semiconductor layers on a sapphire substrate and have got into the limelight.

On the other hand, recently, studies on a blue color based LED and LD using ZnO based oxide semiconductor have been also proceeded. In this case, as a growth method of ZnO based oxide semiconductor layer, MOCVD (Metal Organic Chemical Vapor Deposition) method, MBE (Molecular Beam Epitaxy) method, LA (Laser Ablation) method and the like are considered, however, to date, the MBE method is the most suitable method to laminate layers having different components, each of which is an uniformed component for a light emitting device.

In a MBE method, as a schematic diagram of a MBE device is shown in FIG. 6(a), ZnO is epitaxially grown by irradiating, for example, raw materials from a material source 21 of Zn and a radical source 23 of oxygen toward a substrate 8 consisted of sapphire and the like. At this time, in the case where it is made of an n-type semiconductor layer, while irradiating Al from a material source 22 of Al, and in the case where a p-type semiconductor layer is made, ZnO is epitaxially grown by irradiating nitrogen from a radical source 24 of nitrogen.

In a device shown in FIG. 6(a), a main chamber 1 is a conventional chamber of a MBE apparatus and it is a container capable of maintaining ultra-high vacuum in a cylindrical shape and connected to an air escape (not shown). Then, within it, a substrate holder 4 for holding the substrate 8, on which semiconductor layers are grown, is provided so that the substrate 8 can be heated by a heater 5. And, material sources (cell groups) 21 through 24 for the materials constituting compound semiconductor layers which grows on the substrate 8 are provided as opposing to the substrate 8 held by the substrate holder 4. The material sources include radical cells which supply the material of gases such as oxygen, nitrogen and the like.

Each of the material sources 21 and 22 consists of, for example, a crucible provided with a shutter (not shown) on the front face as well as a heater (not shown) for being capable of evaporating of the raw material on the periphery of the crucible, and the desired material is supplied to the side of the substrate 8. Moreover, in radical cells 23 and 24, an ECR (Electron Cyclotron Resonance) generating plasma, for example, using a microwave is configured so that oxygen and nitrogen excited by plasma are irradiated.

As a schematic diagram nearby a plasma radiation outlet 23a is shown in FIG. 6(b), in this radical cell 23, electrodes 23c and 23d for supplying a high electric field for ion trapper are provided nearby the irradiation outlet 23a of the plasma 23b so that a semiconductor layer grown is not influenced by a charged particle in plasma directly colliding the substrate. Specifically, for example, when oxygen is dissolved into a form of oxygen atoms by plasma, since the energy of a plasma excitation is high, charged particles such as ions such as $O_2$ ion, O ion, a large capacity of electron ray and the like occur. If these charged particles are irradiated on the substrate, since such harmful influences that the surface of the substrate is charged, the growth of crystal is hindered and ZnO deposited is etched and the like are exerted and causes the occurrence of defective crystal, the semiconductor layer having a good crystallinity cannot be obtained.

In most cases, a conventional radical cell device may be provided with electrodes for applying a high electric field nearby the plasma radiation outlet in order to remove the charged particles from the plasma generated. Since this high electric field is on about 100 to 600 V, the electrode of the grounding side is provided so as to directly electrically contact with the metal plate to which the cell is grounded, and the electrode of the high voltage side is provided via insulation porcelain consisted of alumina (not shown).

In a MBE device, for example, when ZnO oxide semiconductor layer is grown, even if it is grown in an undoped manner, there is a problem that it easily becomes an n-type layer and a layer whose n-type carrier concentration is small cannot be obtained, and if it is intended to make a p-type layer, there is a problem that a sufficient high doped p-type layer cannot be formed and the carrier concentration cannot be precisely controlled.

The present inventors have made every efforts to sufficiently control the carrier concentration of an undoped ZnO layer, as a result, have found that Al is mixed up into the ZnO layer, although ZnO layer is made grown in an undoped manner, and which is one of the factors for making it n-type. Specifically, as shown in FIG. 5, as a result of the depth profile of Al in this ZnO layer having being examined by a SIMS analysis method, the existence of Al spanning over the entire growth thickness region of ZnO has been recognized. Then, the present inventors have further every efforts to find the cause of it, as a result, the present inventors have found it is caused by the fact that Al contained within ZnO layer is doped after Al is made free from the insulation porcelain constituting an ion trapper of a radical cell.

SUMMARY OF THE INVENTION

The present invention has been made in consideration of these circumstances, and an object of the present invention is to provide a radical cell device not so as to blow-off and mix up Al into the film even in the case where a thin film is made grown.

Another object of the present invention is to provide a method of manufacturing a Groups II–VI compound semiconductor device such as ZnO based compound semiconductor light emitting device whose emitting light characteristic is excellent, in which, ZnO based compound layer has the high purity without containing undoped Al.

As described above, the present inventors have found that when ZnO based compound semiconductor (which means an oxide containing Zn, and as a concrete example, besides ZnO, meaning ones including the respective oxide of Group IIA and Zn, Group IIB and Zn, or Group IIA and Group IIB and Zn, hereinafter, indicating the same meaning) is grown, even in the case where Al as a dopant is not doped, Al is doped in a comparatively high concentration in the ZnO based compound semiconductor layer, and the insulation porcelain for holding an electrode of ion trapper (charged particle removing means, hereinafter, indicating the same meaning) is the causative factor.

Specifically, it was found that the reason was followings. An electrode of ion trapper is mounted on the metal wall of the plasma chamber as described above via an insulation porcelain, charged particles are curved towards the electrode side by pulling by the electrode of the high electric field, the curved charged particles flow into the electrode and one portion of the curved charged particles also collides the insulation porcelain on which the electrode is mounted as well, and Al of the insulation porcelain is pulled out by its collision, reaches on the substrate surface along with plasma and is made doped within the thin film.

A radical cell device according to the present invention comprising, a plasma chamber in which closing plates are provided on both end portions of a cylindrical body and a gaseous substance is made plasmatic within the plasma chamber, a gas introduction tube which is inserted into one plate of the closing plates for introducing into the plasma chamber a gaseous substance, a plasma radiation outlet provided on the other plate of closing plates, and an electrode of an ion trapper for applying a high electric field, the electrode being provided nearby the passage of plasma outgoing from the plasma radiation outlet, wherein the electrode for applying a high electric field is fixed on a grounded metal plate via an insulation porcelain made of magnesium oxide or quartz.

By thus configuring the radical cell device, the high electric field is applied to the passage of plasma (plasma jet) outgoing from the plasma radiation outlet. And even the charged particles are pulled towards to the electrode by which a high electric field is applied and collide the electrode and the insulation porcelain nearby the electrode, since neither of the electrode and the insulation porcelain contains Al, Al being made free and Al being doped are largely reduced. It should be noted that even if Mg of MgO is made free and mixed up into, since Mg is an element of Group II, and Mg has no harmful influence on the Groups II–IV compound. Moreover, Si of quartz is an element of Group IV, however, even if a radical cell is configured by quartz as an insulation porcelain and an ion trapper is made acted, it has been recognized that little Si is doped and has no influence on the carrier concentration and the like.

Concretely, this is a structure in which the grounded metal plate is mounted on the other plate on which the plasma radiation outlet is provided, the electrode for applying a high electric field is fixed on the metal plate via the insulation porcelain so as to be opposed to a grounded electrode provided and electrically connected to the grounded metal plate, in which the passage of plasma is interposed between them.

Another concrete structure is one in which a metallic protective cover is provided around the plasma chamber, a shutter for opening and closing is provided on a portion corresponding to the passage of plasma of the metallic protective cover, the shutter is shared with the electrode for applying a high electric field, and the shutter is fixed on the protective cover via the insulation porcelain, and in the structure in which the insulation porcelain is formed by quartz or magnesium oxide (MgO).

A method of manufacturing a Groups II–VI compound semiconductor device according to the present invention is characterized in that in the case where a Groups II–VI compound semiconductor layers capable of containing a dopant for light emitting layer forming portion are made grown on the substrate by a MBE method, wherein when the constitutive element or dopant element of the compound semiconductor layers is introduced in a plasmatic condition, the plasmatic condition is generated by using a radical cell device which has an insulation porcelain made of magnesium oxide or quartz for holding an electrode for applying a high electric field of an ion trapper.

DETAILED DESCRIPTION

Figure 1:
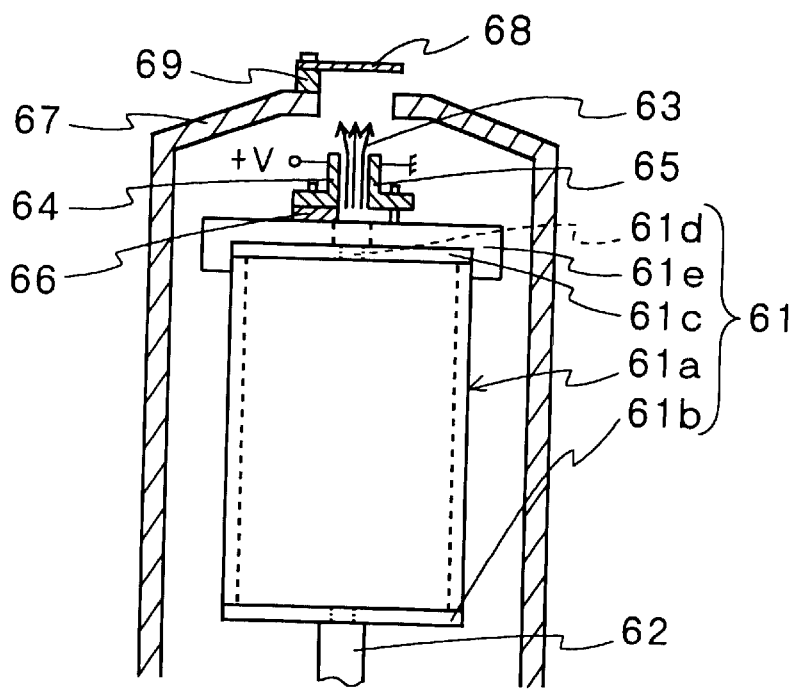
FIG. 1 is a schematic illustration showing a partial sectional view of one embodiment of a radical cell device according to the present invention.

Next, a radical cell device and a method of manufacturing Groups II–VI compound semiconductor device according to the present invention will be described below with reference to the drawings. In a radical cell device according to the present invention, as the schematic illustration of partial sectional view of one embodiment is shown in FIG. 1, the closing plates 61b and 61c are provided on both end portions of the cylindrical body 61a, the gas introduction tube 62 for introducing a gaseous substance is inserted into one plate 61b of the closing plates of the plasma chamber 61 for making the gaseous substance plasmatic within it, and the plasma radiation outlet 61d is provided on the other plate 61c of the closing plates.

Then, the grounded metal plate 61e having the opening the passage of the plasma 63 is mounted on the other closing plate 61c and the electrode 64 for applying a high electric field of ion trapper is provided in opposition to the grounded electrode 65 interposed the passage of the plasma (plasma jet) 63 between them. This electrode 64 for applying a high electric field is fixed on the grounded metal plate 61e via the insulation porcelain 66 consisted of magnesium oxide (MgO) or quartz.

The plasma chamber 61 is a chamber in which plasma is generated, for example, both end portions of the cylindrical body 61a such as circular cylindrical or rectangular cylindrical body are closed by the closing plates 61b and 61c consisted of quartz plate and the like provided with a gaseous substance introduction inlet and the plasma radiation outlet 61d. On one plate 61b of the closing plates, the gas introduction tube 62 for introducing a gaseous substance such as nitrogen, oxygen and the like is provided, and on the other plate 61c of closing plates, the metal plate 61e having the opening for the passage of plasma irradiated from the plasma radiation outlet 61d is provided. The diameter of the plasma radiation outlet 61d is formed to be, for example, on about 0.5–3 mmϕ. In this plasma chamber 61, an introduction means of microwaves (not shown) and within it a magnet and the like are arranged, and the plasma chamber is formed so that an ECR (Electron Cyclotron Resonance) cell is made plasmatic by an electron cyclotron resonance or a RF cell is made plasmatic by applying RF.

Nearby the passage of the plasma 63 outgoing from the plasma radiation outlet 61d, the electrode 64 for applying a high electric field of the ion trapper is provided in opposition to the grounded electrode 65 interposed the passage of the plasma (plasma jet) 63 between them. In an example shown in FIG. 1, the grounded electrode 65 is made as a grounding potential by being mounted so as to be electrically connected to the grounded metal plate 63e, the electrode 64 for applying a high electric field is formed so as to be capable of applying a high electric field of about 100 to 600 V to the metal plate 61e via the insulation porcelain 66. In an example shown in FIG. 1, it is characterized in that this insulation porcelain 66 is consisted of (made of) quartz ($SiO_2$) having a high purity.

Specifically, even if this insulation porcelain 66 is flapped by the charged particles, the insulation porcelain is consisted of the material which does not have a harmful influence on the carrier concentration and electrically conductive type by mixing up the impurities for the purpose of making the Groups II–VI compound layer grown. From the viewpoint of this, the material may not be quartz and it may be magnesium oxide (MgO). This is because MgO has a good insulating property as well and is same Groups II–VI compound, so that even in case that either one is mixed in, the property is not modified at all.

In an example shown in FIG. 1, the metallic protective cover 67 is provided around the plasma chamber 61, and the shutter 68 is provided via the insulation porcelain 69 at the position corresponding to the plasma radiation outlet 61d (plasma jet 63) of the plasma chamber 61. This shutter 68 is formed so that it is capable of rotating by making fixation portion of the insulation porcelain as the axis, and the plasma radiation is capable of being interrupted or opened. Then, in this example, it is configured so that the high electric field is capable of being applied to this shutter 68, and mounted via the insulation porcelain 69 in order to be capable of performing a further ion trapper to be functioning. Therefore, this insulation porcelain 69 is also formed by quartz or MgO as described above.

Figure 3:
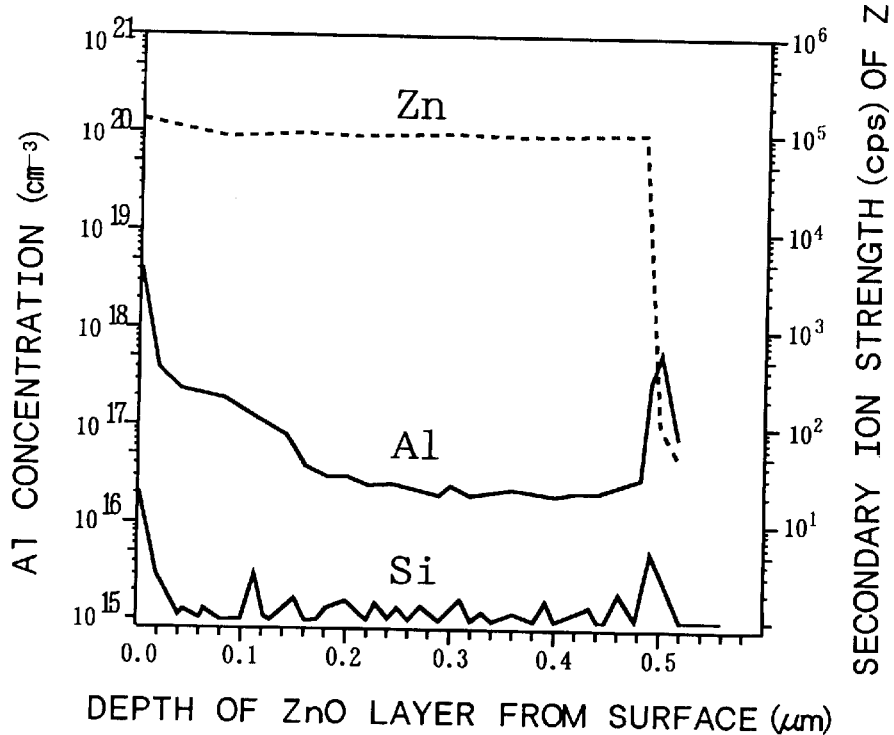
FIGS. 3 (a) to 3 (b) are graphical representations showing the depth profile of Al and the relative secondary ionic strength of Zn when ZnO is made grown by employing a radical cell according to the present invention.
Figure 3:
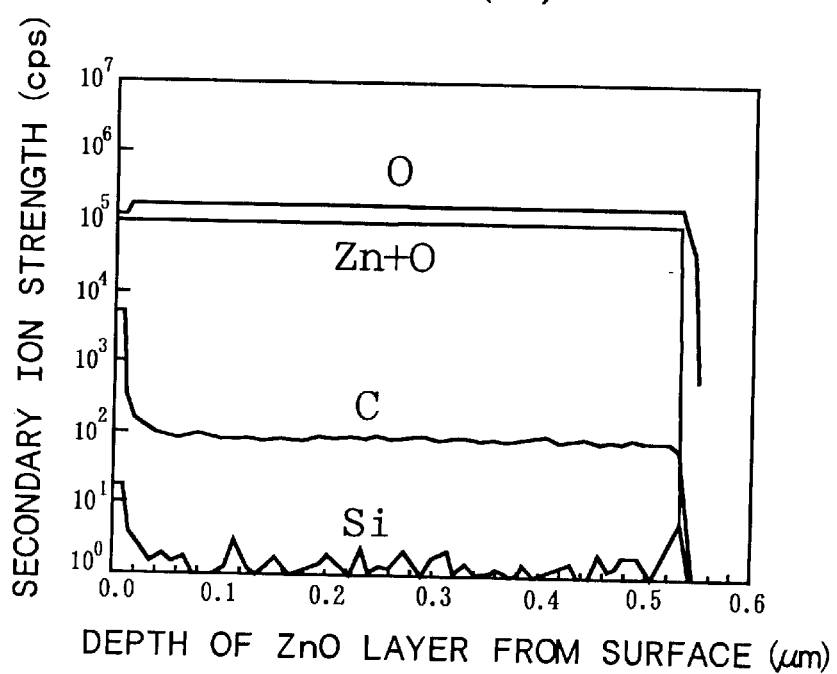
Figure 4:
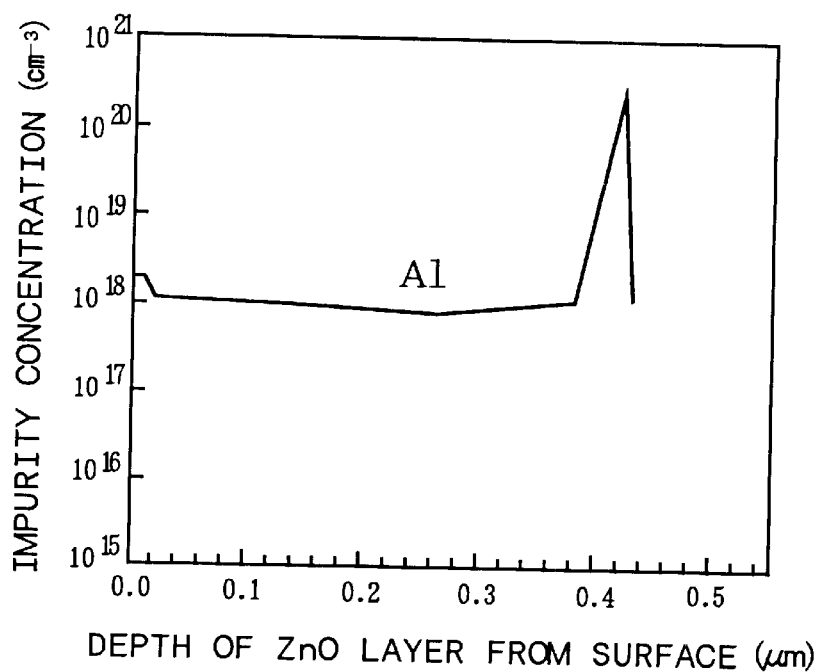
FIG. 4 is a graphical representation showing the concentration of Al when an ion trapper is not acted by employing a conventional radical cell device.
Figure 5:
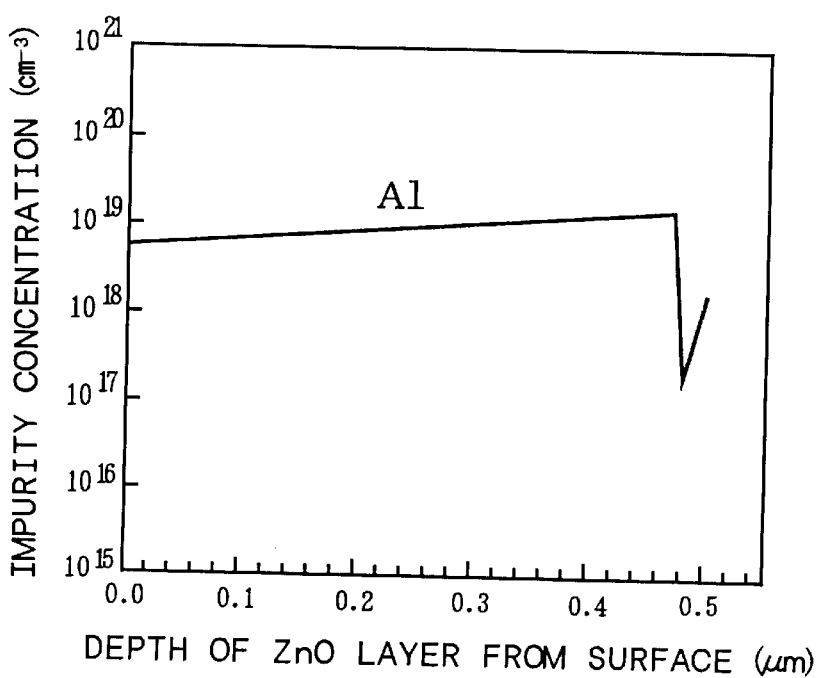
FIG. 5 is a graphical representation showing the concentration of Al when an ion trapper is made acted by employing a conventional radical cell device.
Figure 6:
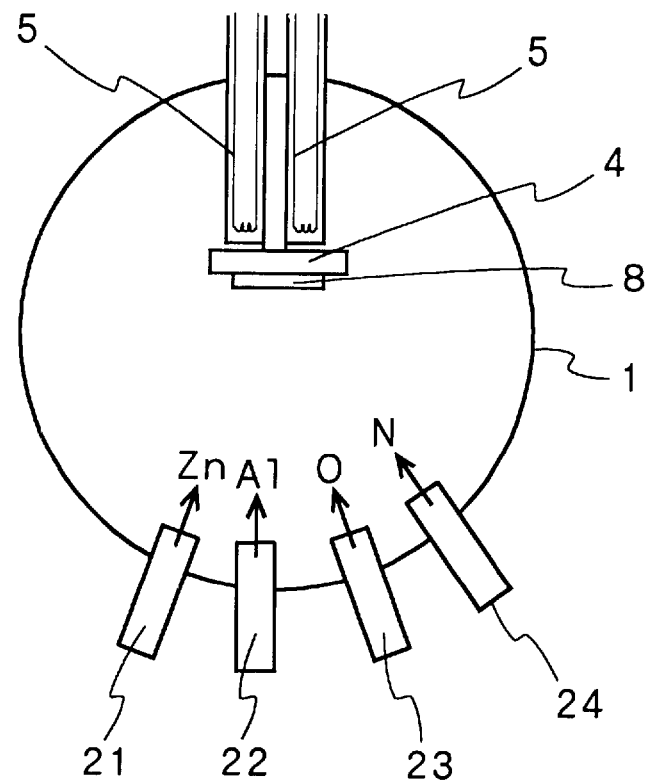
FIGS. 6(a) to 6(b) are a schematic illustration showing a MBE device and a configuration illustration showing an ion trapper.
Figure 6:
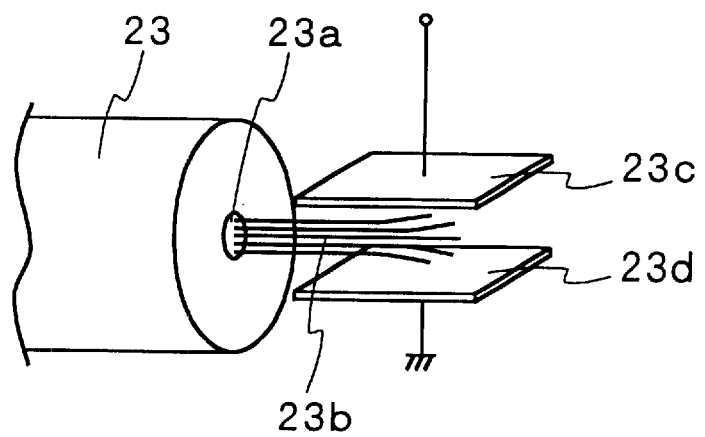

As described above, the present inventors have examined the reason why in the case where ZnO based compound semiconductor is grown, even if ZnO layer is grown in an undoped manner, it becomes a n-type layer. The results of it, which are the depth profiles of Al analyzed by the SIMS (secondary ion mass spectrometer) analysis, are shown in FIGS. 3 to 5. Specifically, if a radical cell device having a conventional insulation porcelain made of alumina is used, and ZnO layer is epitaxially grown in an undoped manner by making an ion trapper act, Al concentration reaches to $10^{19}$ atoms/$cm^3$ as shown in FIG. 5, and if the ion trapper is not made act, the Al concentration is largely reduced to on about $10^{18}$ atoms/$cm^3$ as shown in FIG. 4, but still the Al concentration exists and Al is contained in it. It should be noted that in FIGS. 4 and 5, Al concentration is a value into which a secondary ion strength analyzed by SIMS is converted, that Al impurity concentration is largely varied on the final stage is due to the grown ZnO layer being absent and the variation of material to the sapphire substrate surface from the ZnO (matrix effect).

On the other hand, for Al concentration of ZnO layer which has been grown by generating oxygen plasma using radical cell according to the present invention, in which quartz is used as the insulation porcelain 66 and by making an ion trapper act, as shown in FIG. 3 (a), the impurity concentration of Al is somewhat large on the surface of ZnO layer, however, inside of the ZnO layer, the impurity concentration is smaller as $10^{16} cm^{-3}$ and something, and it is on about numeral value which is little influenced by Al. It is considered that Al is still observed inside of it although it is a low concentration is because alumina is used on the side of a substrate holder of a MBE device and the like. It should be noted that in FIG. 3 (a), for Al, the value is converted from the value measured as a secondary ion strength to a concentration, the strengths of Zn and Si measured as secondary ion strengths are indicated at the same time on the vertical coordinate axis and certain portion of ZnO layer (thickness) is indicated on the horizontal coordinate axis.

Moreover, if an impurity element is examined by means of the relative secondary ion strength at this time, the results are as shown in FIG. 3 (b), an amount of Si which may be a problematic is not contained. Specifically, it is indicated that in the case where ZnO is epitaxially grown by generating plasma using quartz as an insulation porcelain, even if Si of quartz is turned out by an ion impact, little Si is contained in the ZnO layer. It should be noted that in FIG. 3(b), the relative secondary ion strength of O, Zn+O and C is indicated. As it is clear from this FIG. 3(b), if Groups II–VI compound semiconductor layer is grown using a radical cell device according to the present invention, the impurities caused by the radical cell device can be prevented from mixing up into the layer, and characteristics of growth layers such as carrier concentration and the like can be controlled with sufficient precision.

Figure 2:
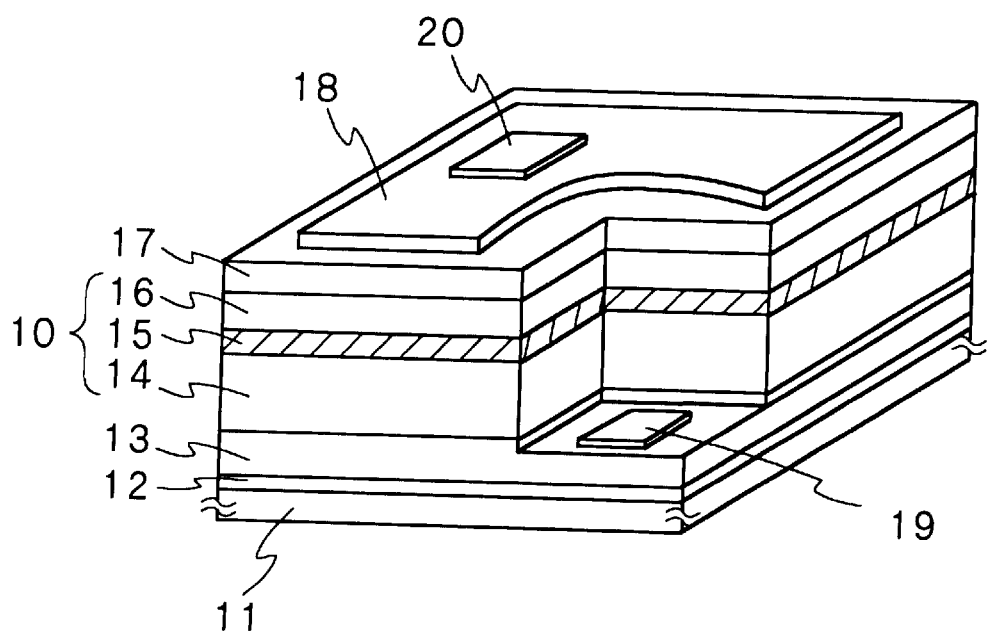
FIG. 2 is an illustration showing an example of an LED chip fabricated by a method according to the present invention.

Next, a method of manufacturing a ZnO based compound semiconductor light emitting device which is an example of Groups II–VI compound semiconductor device using this radical cell device will be described below. In FIG. 2, an example of an LED chip of blue based color (wavelength from ultra violet to yellow) employing ZnO based compound semiconductor is shown.

In order to fabricate this LED, for example, the sapphire substrate 11 is set within the MBE apparatus, the temperature of the substrate surface is measured by a radiation thermometer, the temperature is set to about 350° C., Zn and oxygen is irradiated, a buffer layer 12 which is consisted of ZnO and whose surface is flat is formed into a film in a thickness of about 0.1 μm. Next, the temperature of the substrate is raised to about 600° C., the shutters of the material source (cells) of oxygen radical and Zn are opened, oxygen radical and Zn are irradiated, and an n-type contact layer 13 consisted of ZnO is grown by about 1.5 μm by opening the shutter of Al source of an n-type dopant. As a radical cell of this oxygen radical source, quartz is used as an insulation porcelain holding an ion trapper (electrode) as described above, without using alumina as an insulation porcelain.

Next, in turn, the shutter of Mg is also opened and thereby forming an n-type clad layer 14 consisted of $Mg_y Zn_{1-y} O$ ($0 \leq y < 1$, for example, $y=0.15$) in a thickness of about 2 μm; Mg is stopped, the shutter of Cd source is opened and thereby forming an active layer 15 consisted of $Cd_xZn_{1-x}O$ ($0 \leq x < 1$, for example, $x=0.08$) in a thickness of about 0.1 μm in an undoped manner; Cd is stopped, the shutter of Mg source is opened again, and further the shutter of plasma excitation nitrogen source as a p-type dopant and the shutter of Al or Ga source as a buffer agent are opened, respectively, thereby forming a p-type clad layer 16 consisted of p-type $Mg_yZn_{1-y}O$ ($0 \leq y < 1$, for example, $y=0.15$) in a thickness of about 2 μm, and further Mg is stopped and the growth continues, and thereby forming a p-type contact layer 17 consisted of a p-type ZnO in a thickness of 1 μm. A radical cell device for generating this plasma excitation nitrogen also employs quartz as an insulation porcelain similarly as described above. A light emitting layer forming portion 10 is configured by the n-type clad layer 14, the active layer 15, and the p-type clad layer 16.

Subsequently, a wafer which has been epitaxially grown is taken out from a MBE apparatus, put it into a sputtering apparatus and an ITO film 18 which is a transparent electrically conductive film is provided in a thickness of about 0.15 μm. Subsequently, one portion of laminated semiconductor layers is carried out by a dry etching such as a RIE method, thereby the n-type contact layer 13 is exposed. After that the reverse side of the sapphire substrate 11 are polished, thereby making the thickness of the substrate 11 about 100 μm, a p-side electrode 20 consisted of Ni/Al or the like is formed on the ITO film 18, an n-side electrode 19 consisted of Ti/Au or the like is formed on the surface of the n-type contact layer 13 which has been exposed by etching, respectively by vacuum evaporation using for example, a lift-off method. Subsequently, the wafer is made into chips and thereby obtaining LED chips shown in FIG. 2.

It should be noted that in this example, the light emitting layer forming portion 10 is an LED chip of double heterojunction, however, the other junction structures such as a p-n junction structure of hetero-junction or homo-junction may be available. Moreover, it is similarly available in the case of not an LED but also an LD.

In this case, for example, it is preferable that for example, the active layer 15 is formed by multiple quantum well structure in which the respective 2 to 5 barrier layers and well layers consisted of undoped $Cd_{0.03}Zn_{0.97}O$/$Cd_{0.2}Zn_{0.8}O$ are alternately laminated in a thickness of 5 nm and 4 nm per each layer. Moreover, in the case where the light cannot be sufficiently enclosed within the active layer 15 because the active layer 15 is too thin, for example, light guide layers consisted of ZnO are provided on the both sides of the active layer. Moreover, a transparent electrode consisted of the ITO film 18 is not required, a current injection region is formed by directly patterning and forming a p-side electrode 20 in a stripe shape, by etching the upper portion of semiconductor layers into a mesa type shape, or by embedding a current narrowing layer.

According to a semiconductor light emitting device obtained by the method according to the present invention, the carrier concentration of the semiconductor layer can be controlled to the desired carrier concentration, and the LED having the excellent light emitting characteristics and the high light emitting efficiency can be obtained. Moreover, for the LD, the threshold current value can be lowered, and the semiconductor light emitting device whose light emitting characteristics has been enhanced can be obtained.

The example described above has been an example of a ZnO based compound semiconductor light emitting device, however, in the case where Groups II–VI compound semiconductor device such as ZnSe based compound semiconductor light emitting device is fabricated, the carrier concentration can be similarly made into the desired carrier concentration, and the semiconductor device having the excellent performance can be obtained. Furthermore, in the respective examples described above, the examples of film formation by a MBE method, however, even in the case where a radical cell device is used in a sputtering device, the impurities mixing up into the layers due to the radical cell device can be similarly prevented.

According to the present invention, even if an ion trapper mounted on a radical cell device for generating plasma is acted, impurities is not mixed up within the layers in which harmful impurities are made free and the film is formed. As a result, when a Groups II–VI compound semiconductor layer is formed by a MBE method and the like using this radical cell device, a semiconductor layer of the desired carrier concentration is obtained, and a Groups II–VI compound semiconductor device such as a semiconductor light emitting device having an extremely excellent performance is obtained.

Although preferred examples have been described in some detail it is to be understood that certain changes can be made by those skilled in the art without departing from the spirit and scope of the invention as defined by the appended claims.

What is claimed is:

1. A radical cell device comprising:
   a plasma chamber in which closing plates are provided on both end portions of a cylindrical body and a gaseous substance is made plasmatic within said plasma chamber;
   a gas introduction tube which is inserted into one plate of said closing plates and introduces into said plasma chamber a gaseous substance;
   a plasma radiation outlet provided on the other plate of said closing plates; and
   an electrode of an ion trapper for applying a high electric field, said electrode being provided nearby the passage of plasma outgoing from said plasma radiation outlet;
   wherein said electrode for applying a high electric field is fixed on a grounded metal plate via an insulation porcelain made of magnesium oxide or quartz.

2. The radical cell device of claim 1, in which said grounded metal plate is mounted on said other plate on which said plasma radiation outlet is provided, said electrode for applying a high electric field is fixed on said metal plate via said insulation porcelain so as to be opposed to a grounded electrode provided and electrically connected to said grounded metal plate, in which said passage of plasma is interposed between said electrode for applying a high electric filed and said grounded electrode.

3. The radical cell device of claim 1 in which a metallic protective cover is provided around said plasma chamber, a shutter for opening and closing is provided on a portion corresponding to said passage of plasma of said metallic protective cover, said shutter is shared with said electrode for applying a high electric field, and said shutter is fixed on said metallic protective cover via said insulation porcelain.

* * * * *